(12) United States Patent
Miwa et al.

(10) Patent No.: US 11,749,494 B2
(45) Date of Patent: Sep. 5, 2023

(54) CHARGED PARTICLE BEAM APPARATUS

(71) Applicant: Hitachi High-Tech Corporation, Tokyo (JP)

(72) Inventors: Takafumi Miwa, Tokyo (JP); Yohei Nakamura, Tokyo (JP); Natsuki Tsuno, Tokyo (JP); Heita Kimizuka, Tokyo (JP); Muneyuki Fukuda, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 40 days.

(21) Appl. No.: 17/545,936

(22) Filed: Dec. 8, 2021

(65) Prior Publication Data

US 2022/0102108 A1 Mar. 31, 2022

Related U.S. Application Data

(63) Continuation of application No. 16/927,932, filed on Jul. 13, 2020, now Pat. No. 11,398,366.

(30) Foreign Application Priority Data

Aug. 8, 2019 (JP) .................. 2019-146177

(51) Int. Cl.
*H01J 37/22* (2006.01)
*H01J 37/244* (2006.01)
*G01N 23/2251* (2018.01)

(52) U.S. Cl.
CPC .......... *H01J 37/22* (2013.01); *G01N 23/2251* (2013.01); *H01J 37/244* (2013.01);
(Continued)

(58) Field of Classification Search
CPC .. H01J 37/22; H01J 37/244; H01J 2237/2482; H01J 2237/2448; H01J 43/00;
(Continued)

(56) References Cited

U.S. PATENT DOCUMENTS 7,026,615 B2   4/2006   Takane et al.
7,114,136 B2   9/2006   Chase et al.
(Continued)

FOREIGN PATENT DOCUMENTS

EP   1267392 B1   7/2013
JP   H5275045     10/1993
(Continued)

OTHER PUBLICATIONS

Non Final Office Action dated Jun. 4, 2021 in U.S. Appl. No. 16/927,925.
(Continued)

*Primary Examiner* — David A Vanore
(74) *Attorney, Agent, or Firm* — MILES & STOCKBRIDGE, P.C.

(57) ABSTRACT

A computing unit generates a to-be-used-in-computation netlist on the basis of a to-be-used-in-calculation device model corresponding to a correction sample, estimates a first application result, on the basis of the to-be-used-in-computation netlist and an optical condition, when a charged particle beam is applied to the correction sample under the optical condition, compares the first application result and a second application result based on a detection signal when the charged particle beam is applied to the correction sample under the optical condition, and corrects the optical condition when the first application result and the second application result differ from each other.

16 Claims, 12 Drawing Sheets

(52) U.S. Cl.
CPC ... *G01N 2223/07* (2013.01); *G01N 2223/507* (2013.01); *G01N 2223/646* (2013.01); *H01J 2237/2448* (2013.01); *H01J 2237/2482* (2013.01)

(58) Field of Classification Search
CPC ......... G01N 23/2251; G01N 2223/646; G01N 2223/07; G01N 2223/507
See application file for complete search history.

(56) References Cited

U.S. PATENT DOCUMENTS

| | | | |
|---|---|---|---|
| 7,235,782 | B2 | 6/2007 | Takane et al. |
| 8,725,667 | B2 | 5/2014 | Kaushal et al. |
| 9,111,717 | B2 | 8/2015 | Asahata et al. |
| 9,536,038 | B1 * | 1/2017 | Quinton ............... G06F 30/3312 |
| 9,916,965 | B2 | 3/2018 | Bhaskar et al. |
| 9,946,165 | B2 | 4/2018 | Ypma et al. |
| 9,966,225 | B2 * | 5/2018 | Bizen ...................... H01J 37/24 |
| 10,026,589 | B1 * | 7/2018 | Monahan ............. H01J 37/265 |
| 10,180,402 | B2 | 1/2019 | Stoker et al. |
| 10,274,834 | B2 | 4/2019 | Ypma et al. |
| 10,642,162 | B2 | 5/2020 | Ypma et al. |
| 10,714,304 | B2 * | 7/2020 | Fukuda .................... H01J 37/22 |
| 10,818,001 | B2 | 10/2020 | Leung et al. |
| 10,872,742 | B2 * | 12/2020 | Miwa ...................... H01J 37/28 |
| 10,879,037 | B2 * | 12/2020 | Tsuno .................... H01J 37/265 |
| 10,971,330 | B2 | 4/2021 | Torikawa |
| 10,971,347 | B2 * | 4/2021 | Nakamura ............. H01J 37/265 |
| 11,011,348 | B2 * | 5/2021 | Bizen ...................... H01J 37/10 |
| 11,043,359 | B2 * | 6/2021 | Nakamura ............. H01J 37/265 |
| 11,355,308 | B2 * | 6/2022 | Shirasaki .............. H01J 37/268 |
| 11,398,366 | B2 * | 7/2022 | Miwa ...................... H01J 37/28 |
| 11,398,367 | B2 * | 7/2022 | Miwa ...................... H01J 37/244 |
| 2003/0057971 | A1 | 3/2003 | Nishiyama et al. |
| 2003/0094572 | A1 | 5/2003 | Matsui et al. |
| 2008/0077376 | A1 | 3/2008 | Belhaddad et al. |
| 2010/0115478 | A1 | 5/2010 | Pedenon et al. |
| 2012/0126116 | A1 | 5/2012 | Tanaka et al. |
| 2013/0200255 | A1 | 8/2013 | Schwarzband et al. |
| 2021/0042900 | A1 * | 2/2021 | Kimizuka ............... G06T 7/001 |
| 2021/0043412 | A1 * | 2/2021 | Miwa ..................... H01J 37/244 |
| 2021/0043413 | A1 | 2/2021 | Miwa et al. |
| 2021/0066028 | A1 * | 3/2021 | Shirasaki .............. H01J 37/226 |
| 2022/0102109 | A1 * | 3/2022 | Miwa ..................... H01J 37/244 |
| 2022/0108866 | A1 * | 4/2022 | Shirasaki .............. H01J 37/226 |

FOREIGN PATENT DOCUMENTS

| | | |
|---|---|---|
| JP | 2002328015 A | 11/2002 |
| JP | 2003100823 A | 4/2003 |
| JP | 2003151483 A | 5/2003 |
| JP | 2008130582 A | 6/2008 |
| JP | 2010129516 A | 6/2010 |
| JP | 2010205864 A | 9/2010 |
| JP | 2011033423 A | 2/2011 |
| JP | 2011186044 A | 9/2011 |
| JP | 2012178236 A | 9/2012 |
| JP | 2013161795 A | 8/2013 |
| JP | 2013178143 A | 9/2013 |
| JP | 6272487 B2 | 1/2018 |
| TW | 201104452 A | 2/2011 |
| TW | 201516598 A | 5/2015 |
| TW | 201734439 A | 10/2017 |
| WO | 0171782 A1 | 9/2001 |

OTHER PUBLICATIONS

Non Final Office Action dated Jun. 2, 2021 in U.S. Appl. No. 16/928,931.

Office Action dated Jun. 22, 2021 in Taiwanese Applcation No. 109122980.

Office Action dated Feb. 19, 2022 in Korean Application No. 10-2020-0075551.

* cited by examiner

FIG. 4

| ID | MODEL | MATHEMATICAL EXPRESSION | PARAMETER TYPE | PARAMETER VALUE | ... |
|---|---|---|---|---|---|
| | | | | | |
| DM1 | RC PARALLEL | A+Bexp(−t/RC) | RESISTANCE R | α | |
| | | | CAPACITANCE C | β | |
| ... | ... | ... | ... | ... | ... |

TO-BE-USED-IN-CALCULATION DEVICE MODEL — 42

```
R9 N013 N011 1k
X1 N001 N011 N021 NMOS
```

CHARGED PARTICLE BEAM APPARATUS

BACKGROUND OF THE INVENTION

1. Field of the Invention

The present invention relates to a charged particle beam apparatus.

2. Description of the Related Art

Charged particle beam apparatuses such as electron microscopes and ion microscopes are used in observation of various samples having a fine structure. For example, for the purpose of process control on a manufacturing process of semiconductor devices, a scanning electron microscope that is one of the charged particle beam apparatuses is used in measurement of dimensions of a semiconductor device pattern formed on a semiconductor wafer serving as a sample, defect inspection of the semiconductor device pattern, or the like.

A method known as one of the sample analysis methods using an electron microscope is to form a potential contrast image from secondary electrons obtained through application of an electron beam to a sample and evaluate electrical resistance of an element formed on the sample on the basis of analysis of the potential contrast image.

For example, JP 2003-100823 A discloses a method for identifying a defect by calculating an electrical resistance value from a potential contrast. JP 2008-130582 A discloses a method for predicting characteristics of a defect in an electric resistance value or the like by creating, as an equivalent circuit, a netlist that describes information on electrical characteristics and connectivity of circuit elements from a potential contrast.

SUMMARY OF THE INVENTION

For inspection and measurement of semiconductor devices, it is required that a defect in electrical characteristics of the devices in a manufacturing process be detected. However, with the techniques disclosed in JP 2003-100823 A and JP 2008-130582 A, it is difficult to estimate the electrical characteristics with consideration given to interactions between a plurality of the devices using design data and inspection measurement data. Further, when the electrical characteristics are estimated using a plurality of apparatuses, an error may occur in the estimation result between apparatuses.

Therefore, an object of the present invention is to reduce an error in charged particle beam application result of a sample between apparatuses.

The following is a brief description of the summary of a primary aspect of the invention disclosed herein.

A charged particle beam apparatus according to a primary aspect of the present invention includes a database configured to store a to-be-used-in-calculation device model for use in estimation of a circuit of a sample or correction sample and an optical condition under which a charged particle beam is applied to the sample or the correction sample, a charged particle beam optical system configured to control the charged particle beam applied to the sample or the correction sample under the optical condition, a detector configured to detect secondary electrons emitted from the sample or the correction sample excited by the application of the charged particle beam and output a detection signal based on the secondary electrons, and a computing unit configured to generate a to-be-used-in-computation netlist on the basis of the to-be-used-in-calculation device model corresponding to the correction sample, estimate, on the basis of the to-be-used-in-computation netlist and the optical condition, a first application result when the charged particle beam is applied to the correction sample under the optical condition, compare the first application result with a second application result based on the detection signal when the charged particle beam is applied to the correction sample under the optical condition, and correct the optical condition when the first application result and the second application result differ from each other.

The following is a brief description of an effect obtained by the primary aspect of the invention disclosed herein.

That is, according to the primary aspect of the present invention, it is possible to reduce an error, between apparatuses, in result of charged particle beam application to a sample.

BRIEF DESCRIPTION OF THE DRAWINGS

FIG. 4 is a diagram showing an example of a to-be-used-in-calculation device model stored in a database;

FIGS. 11A to 11C are diagrams showing another example of the result display screen after circuit estimation;

DESCRIPTION OF THE PREFERRED EMBODIMENTS

Figure 1:
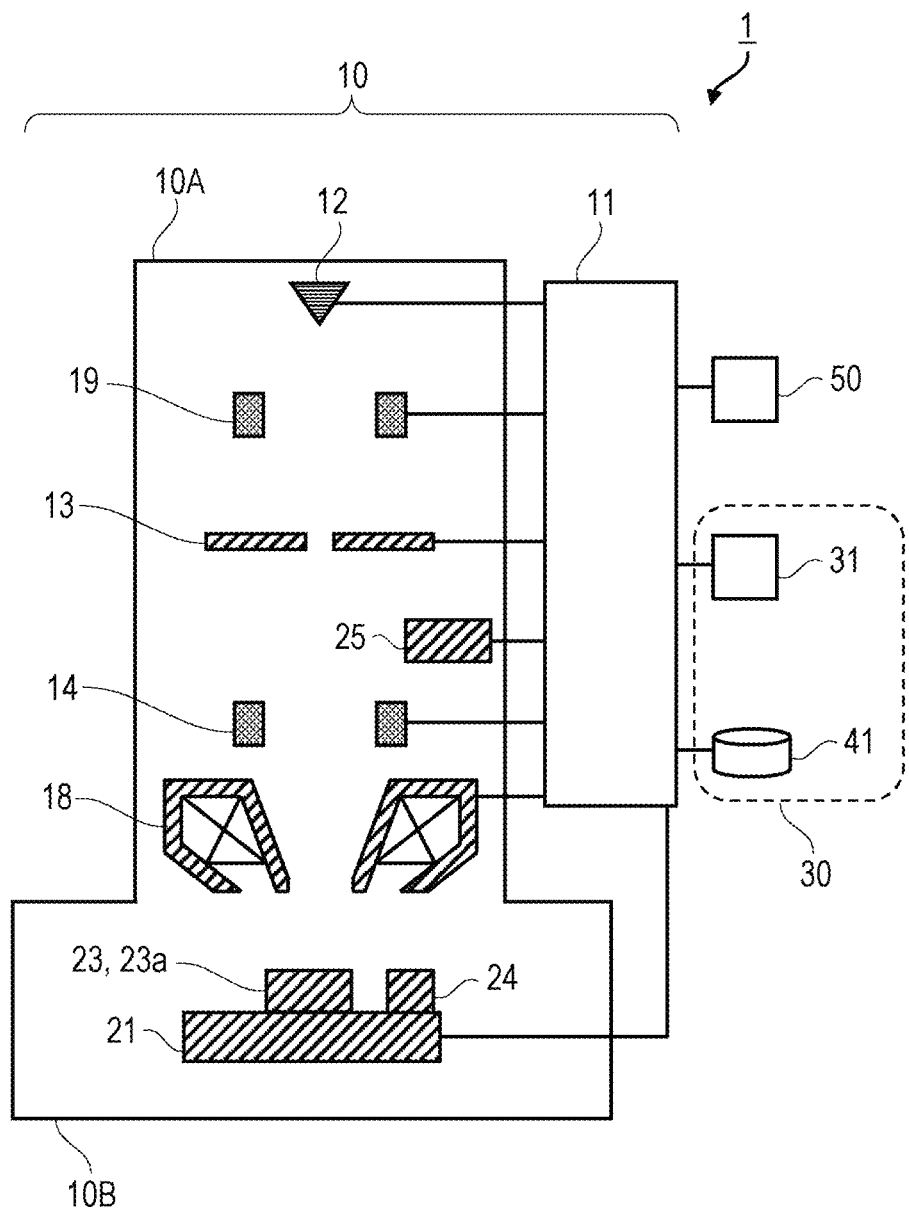
FIG. 1 is a schematic diagram showing an example of a structure of a charged particle beam apparatus according to a first embodiment of the present invention.

Preferred embodiments of the present invention will be described below with reference to the accompanying drawings. Each of the embodiments described below is an example for practicing the present invention and is not intended to limit the technical scope of the present invention. Note that, in the embodiments, components having the same function are denoted by the same reference numerals, and repeated description of such components will be omitted unless particularly necessary.

First Embodiment

<Structure of Charged Particle Beam Apparatus>

Figure 2:
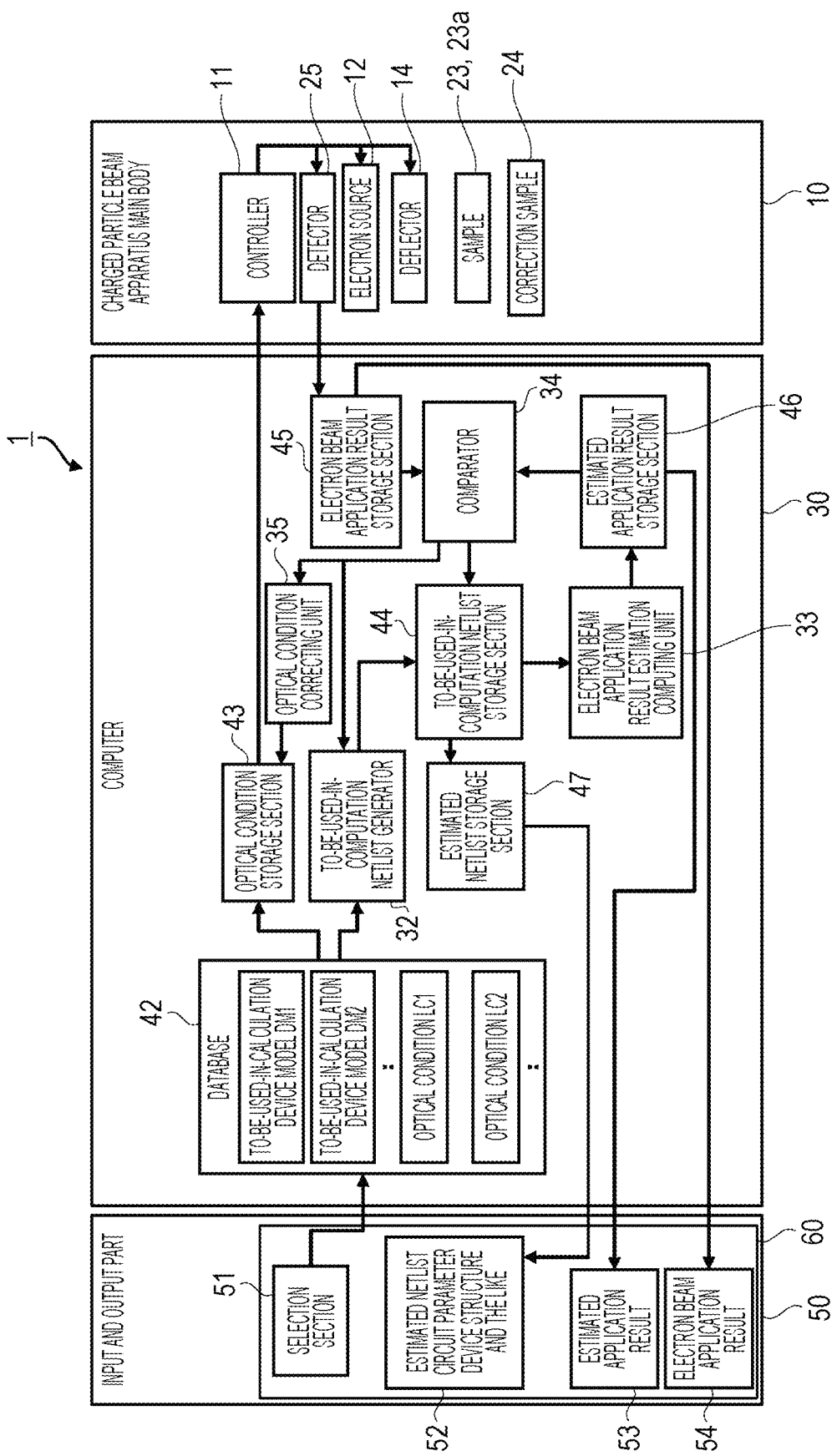
FIG. 2 is a block diagram showing an example of the structure of the charged particle beam apparatus according to the first embodiment of the present invention.

FIG. 1 is a schematic diagram showing an example of a structure of a charged particle beam apparatus according to a first embodiment of the present invention. FIG. 2 is a block diagram showing an example of the structure of the charged particle beam apparatus according to the first embodiment of the present invention. As shown in FIGS. 1 and 2, a charged particle beam apparatus 1 includes a charged particle beam apparatus main body 10, a computer 30, and an input and output part 50.

<Charged Particle Beam Apparatus Main Body>

The charged particle beam apparatus main body 10 has a structure where a lens barrel 10A is mounted on a sample chamber 10B in which a sample 23 to be inspected is held, and a controller 11 is disposed outside the lens barrel 10A and the sample chamber 10B. In the lens barrel 10A, an electron source (charged particle source) 12 that emits an electron beam (charged particle beam), a pulsed electron generator 19 that pulses the electron beam, a diaphragm 13 that regulates an application current of the electron beam thus emitted, a deflector 14 that controls an application direction of the electron beam, an objective lens 18 that causes the electron beam to converge, and the like are held. Although not shown, in the lens barrel 10A, a condenser lens is provided. Note that, unless the electron beam is pulsed, the pulsed electron generator 19 need not be provided.

In the lens barrel 10A, a detector 25 that detects secondary electrons emitted from the sample 23 or correction sample 24 excited by the application of the electron beam, and outputs a detection signal based on the secondary electrons and the like are further held. The detection signal is used in generation of a scanning electron microscopy (SEM) image, measurement of the size of the sample 23 or correction sample 24, measurement of electrical characteristics, and correction of an optical condition under which the electron beam is applied to the sample 23 or the correction sample 24.

In the sample chamber 10B, a stage 21, the sample 23, the correction sample 24, and the like are held. The sample 23 and the correction sample 24 are mounted on the stage 21. Examples of the sample 23 include a semiconductor wafer including a plurality of semiconductor devices, and an individual semiconductor device. The stage 21 is provided with a stage drive mechanism (not shown) and is movable within the sample chamber 10B under the control of the controller 11.

The correction sample 24 is a sample for use in correction of the optical condition in a plurality of charged particle beam apparatuses. Specifically, in the plurality of charged particle beam apparatuses, even when the charged particle beam is applied to the same sample under the same optical condition, application results may be different from each other. Such a difference in application result between the plurality of apparatuses may be referred to as "machine difference". In order to reduce such a machine difference, the optical condition is corrected using a correction sample whose to-be-used-in-calculation device model (to be described in detail later) representing a circuit configuration, electrical characteristics, or the like is known.

As the correction sample 24, a test element group (TEG) including a plurality of elements having different electric characteristics can be used. Alternatively, an antenna TEG or time dependent dielectric breakdown (TDDB) TEG can be used as the correction sample 24. Further alternatively, a TEG or the like for use in evaluation of leakage current of a p-n junction can be used as the correction sample 24. The correction sample 24 may be provided separately from the sample 23 as shown in FIG. 1. Further, the correction sample 24 may be formed on a wafer prepared in advance for use in apparatus maintenance and transported as the sample 23 into the apparatus.

Figure 3A:
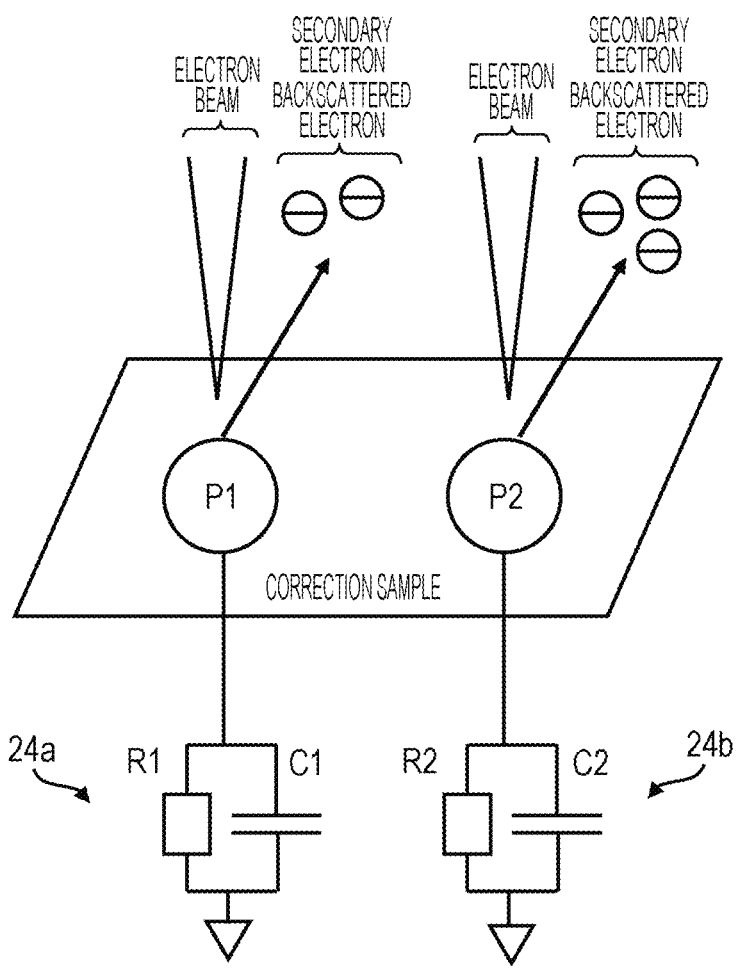
FIGS. 3A and 3B are diagrams showing a correction sample.
Figure 3B:
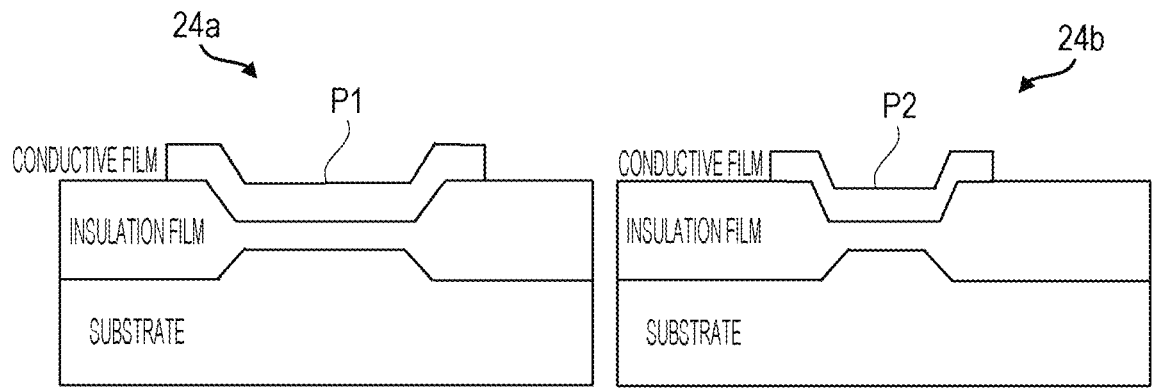

FIGS. 3A and 3B are diagrams showing an example of the correction sample. FIGS. 3A and 3B show a correction sample including a plurality of elements. FIG. 3A is a diagram schematically showing circuits (equivalent circuits) of a plurality of elements 24a, 24b, secondary electrons emitted by the application of the electron beam, and the like. FIG. 3B shows cross-sectional views of the plurality of elements 24a, 24b. The circuit of the element 24a is an RC parallel circuit in which a resistor having a resistance value R1 and a capacitor having a capacitance value C1 are connected in parallel. On the other hand, the circuit of the element 24b is an RC parallel circuit in which a resistor having a resistance value R2 and a capacitor having a capacitance value C2 are connected in parallel. Note that P1, P2 denote electrodes, for example.

As shown in FIG. 3B, the element 24a is larger than the element 24b in region where an insulation film located below a conductive film serving as the electrode becomes thinner. Accordingly, the element 24a is larger than the element 24b in range of the electrode. When a plurality of elements are provided, the correction sample may include a plurality of elements that are similar in circuit structure but different in size.

The controller 11 is a functional block responsible for controlling components of the charged particle beam apparatus main body 10. The controller 11 controls the operation of each component such as the electron source 12, the pulsed electron generator 19, the diaphragm 13, the deflector 14, and the objective lens 18 under, for example, an optical condition input from the computer 30 and the like. As described above, the controller 11, the electron source 12, the pulsed electron generator 19, the diaphragm 13, the deflector 14, the objective lens 18, and the like constitute a charged particle beam optical system BS that controls the electron beam.

Further, the controller 11 moves the sample 23 to a predetermined position by controlling the stage drive mechanism under, for example, the optical condition input from the computer 30 and the like. Further, the controller 11 controls a power supply or control signal supply to the detector 25 to control a process of detecting the secondary electrons performed by the detector 25.

The controller 11 is implemented with a program executed by a processor such as a CPU. Further, the controller 11 may be configured by, for example, a field-programmable gate array (FPGA) or an application specific integrated circuit (ASIC).

<Computer>

As shown in FIG. 1, the computer 30 includes a computing unit 31 and a storage device 41. The computing unit 31 is a functional block responsible for estimating a circuit (or equivalent circuit) of the sample 23 or correction sample 24. As shown in FIG. 2, for example, the computing unit 31 includes a to-be-used-in-computation netlist generator 32, an electron beam application result estimation computing unit 33, a comparator 34, and an optical condition correcting unit 35. The to-be-used-in-computation netlist generator 32 generates a to-be-used-in-computation netlist corresponding to the sample 23 or correction sample 24 on the basis of the to-be-used-in-calculation device model (to be described later) and the optical condition. Further, the to-be-used-in-computation netlist generator 32 also updates the to-beused-in-computation netlist on the basis of a comparison result from the comparator 34.

The electron beam application result estimation computing unit 33 estimates an electron beam application result on the basis of the to-be-used-in-computation netlist generated by the to-be-used-in-computation netlist generator 32. The comparator 34 compares the electron beam application result estimated by the electron beam application result estimation computing unit 33 (first application result) with an actually measured electron beam application result (second application result).

The optical condition correcting unit 35 corrects the optical condition on the basis of the comparison result between the first application result and the second application result from the comparator 34. The optical condition correcting unit 35 corrects, for example, the optical condition stored in an optical condition storage section 43. That is, the optical condition correction is made on the optical condition related to the last electron beam application.

In addition to these processes, the computing unit 31 performs a process of displaying the estimated electron beam application result, the measured electron beam application result, and a netlist identified for the sample 23 (hereinafter, also referred to as "estimated netlist"), a process of generating an inspection image (SEM image or the like) of the sample 23 on the basis of the detection signal, measuring the size of the sample 23, and measuring the electrical characteristics of the sample 23, and the like.

The computing unit 31 may be implemented with a program executed by a processor such as a CPU, as in the controller 11, or alternatively, may be configured by an FPGA, an ASIC, or the like.

The storage device 41 includes a database 42, an optical condition storage section 43, a to-be-used-in-computation netlist storage section 44, an electron beam application result storage section 45, and an estimated application result storage section 46. The database 42 stores to-be-used-in-calculation device models (for example, DM1 and DM2) and optical conditions (for example, LC1 and LC2) used in generation of the to-be-used-in-computation netlist. Note that the to-be-used-in-calculation device model includes a model representing a defect in a sample.

A user may operate the input and output part 50 to register the to-be-used-in-calculation device models and the optical conditions, or alternatively, the computer 30 may be connected to an external device to receive the to-be-used-in-calculation device models from the external device. The database 42 stores the to-be-used-in-calculation device models and the optical conditions, for example, in the form of a look up table (LUT).

FIG. 4 is a diagram showing an example of the to-be-used-in-calculation device model stored in the database. A unique ID 42a (for example, DM1 and DM2) is assigned to each of to-be-used-in-calculation device models, and each of the to-be-used-in-calculation device models is identified by the ID 42a. The database 42 stores the to-be-used-in-calculation device model for use in inspection of the sample 23 and the to-be-used-in-calculation device model corresponding to the correction sample 24.

Each of the to-be-used-in-calculation device models includes pieces of information such as a model 42b, a mathematical expression 42c, a parameter type 42d, a parameter value 42e, and other data 42f. Note that, in each of the to-be-used-in-calculation device models, only some of the pieces of information may be defined.

The model 42b is information that defines a circuit of the device. Information defining a circuit such as an RC parallel circuit is registered as the model 42b. This circuit may be a model representing an accurate circuit configuration or a model representing an equivalent circuit. Alternatively, a waveform model of the device or the like may be registered as the model 42b. The mathematical expression 42c includes information that defines electrical characteristics or the like of the device that cannot be expressed by the circuit. The mathematical expression 42c may be an expression that represents a time-series change in electrical characteristics or the like. The parameter type 42d is information that defines a type of circuit element included in the device, such as resistance (R) or capacitance (C). The parameter value 42e is associated with each element of the parameter type 42d and is information that defines a value of the circuit element associated with the parameter type 42d. For example, when the resistance (R) and the capacitance (C) are registered as the parameter types, their respective parameter values are a resistance value and a capacitance value. The other data 42f includes information such as a shape of the device or physical properties of the device.

Figure 5:
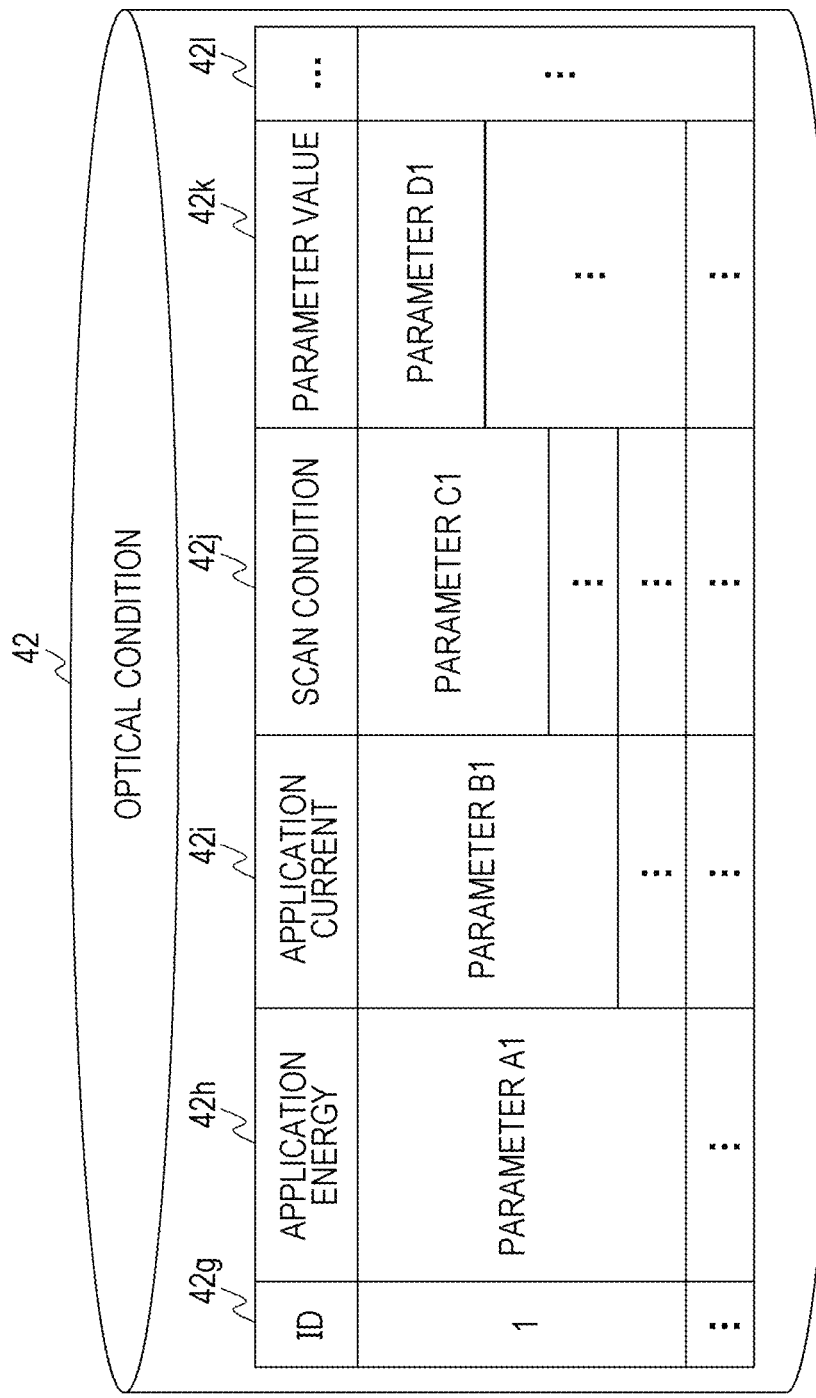
FIG. 5 is a diagram showing an example of an optical condition stored in the database.

FIG. 5 is a diagram showing the optical condition stored in the database. A unique ID 42g (for example, LC1 and LC2) is assigned to each of the optical conditions, and each of the optical conditions is identified by the ID 42g. Each of the optical conditions includes pieces of information such as application energy 42h, an application current 42i, a scan condition 42j, a parameter value 42k, and other data 42l. Note that, in each of the optical conditions, only some of the pieces of information may be defined. Note that a reference optical condition for use in correction of the optical condition applied to the correction sample 24 may be separately stored in the database.

The application energy 42h is information that defines energy of the charged electron beam applied to the sample. The application energy includes, for example, an electron accelerating voltage or retarding voltage. Herein, the retarding voltage refers to a voltage that decelerates the electron beam (charged particle beam) immediately before the sample by applying the voltage to the sample. The application current 42i is information that defines the current of the electron beam. The application current may also be referred to as a probe current.

The scan condition 42j is information that defines an electron beam application method. The scan condition 42j includes, for example, pieces of information such as a scan speed (scanning speed) and a scanning interval. The parameter value 42k is information that defines a parameter associated with the application of the electron beam. The parameter value 42k includes, for example, pieces of information such as a magnification, an aperture angle, and a working distance. The other data 42l includes the other pieces of information associated with a corresponding optical condition. Further, the other data 42l may include an electron beam pulse conversion condition (modulation condition). The electron beam pulse conversion condition includes, for example, a pulse width, a duty cycle, a frequency, any pattern in which the pulse width and the duty cycle change with time, and the like.

Note that the optical condition may be referred to as an electron optical condition, for example.

The optical condition storage section 43 stores a selected electron beam optical condition or an optical condition corrected by the optical condition correcting unit 35. Note that the optical condition stored in the optical condition storage section 43 may be the above-described reference optical condition or an optical condition that results from correcting the reference optical condition.

The to-be-used-in-computation netlist storage section 44 stores the to-be-used-in-computation netlist generated by the to-be-used-in-computation netlist generator 32. The electron beam application result storage section 45 stores the electron beam application result of the sample 23 actually measured on the basis of the detection signal output from the detector 25. The electron beam application result stored in the electron beam application result storage section 45 may be the detection signal output from the detector 25, the SEM image manipulate on the basis of the detection signal, or the like. The estimated application result storage section 46 stores the electron beam application result of the sample 23 or correction sample 24 estimated by the electron beam application result estimation computing unit 33.

The storage device 41 is configured by, for example, a non-volatile memory such as a flash memory. Further, some of the storage sections included in the storage device 41 may be configured by a volatile memory such as a dynamic random access memory (DRAM) or a static random access memory (SRAM). Each of the storage sections included in the storage device 41 may be provided as a separate device, or alternatively, as a separate storage area defined in one storage device.

<Input and Output Part>

The input and output part 50 is a functional block responsible for operations on the charged particle beam apparatus 1, selection of the to-be-used-in-calculation device model or optical condition, display of the electron beam application result and estimated application result of the sample 23, and the estimated netlist, and the like. The input and output part 50 includes a display 60 of, for example, a touch screen type. On the display 60, for example, an operation panel of the charged particle beam apparatus 1, a selection section 51 for use in selection of the to-be-used-in-calculation device model or optical condition, an estimated netlist 52, an estimated application result 53, an electron beam application result 54, and the like are displayed.

<Optical Condition Correction Method>

Figure 6:
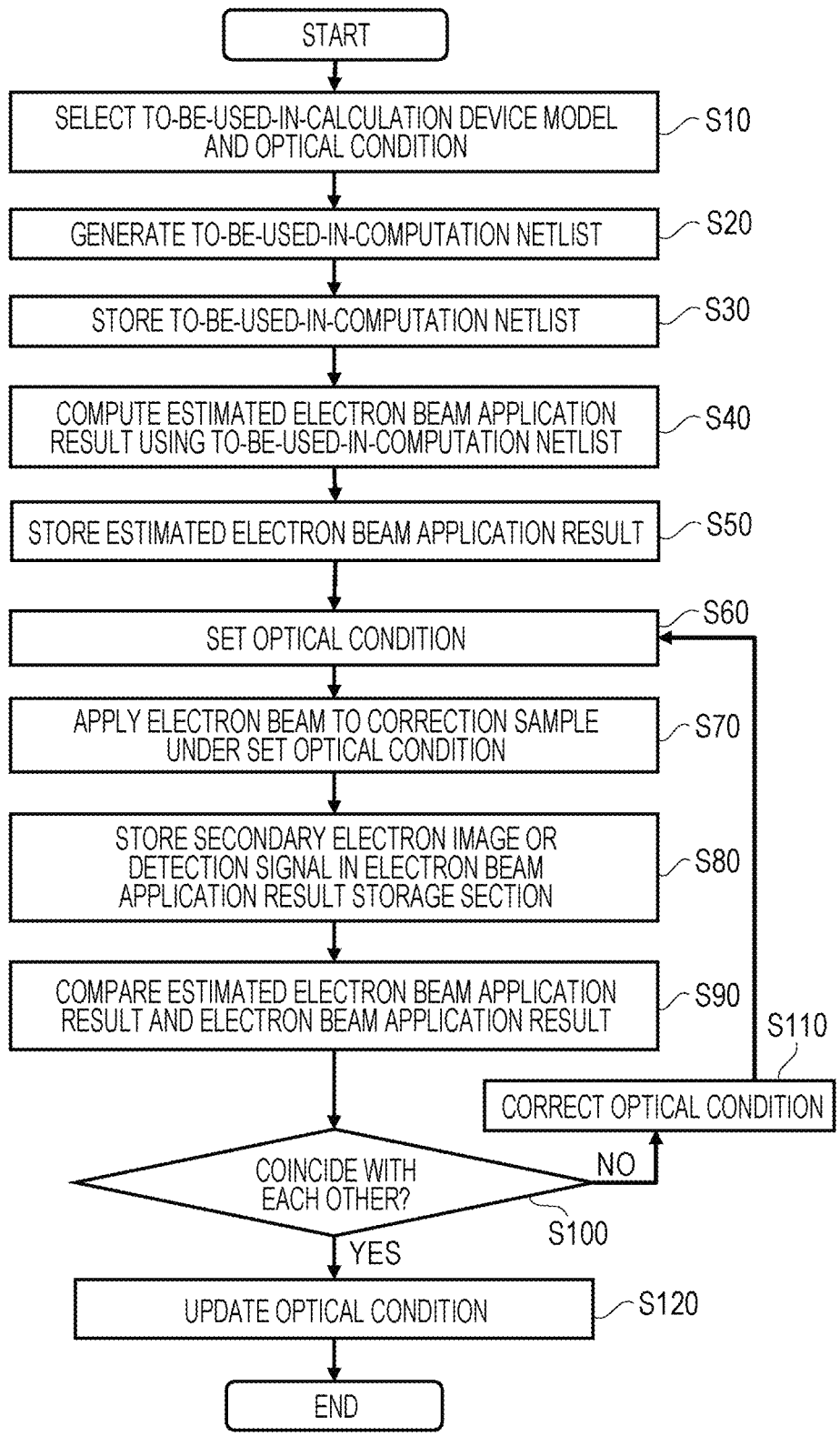
FIG. 6 is a flowchart showing an example of an optical condition correction method according to a first embodiment of the present invention.

Next, an optical condition correction method will be described. According to the present embodiment, the optical condition is corrected using the correction sample 24. FIG. 6 is a flowchart showing an example of the optical condition correction method according to the first embodiment of the present invention. In FIG. 6, the optical condition is corrected in steps S10 to S120.

Figure 7:
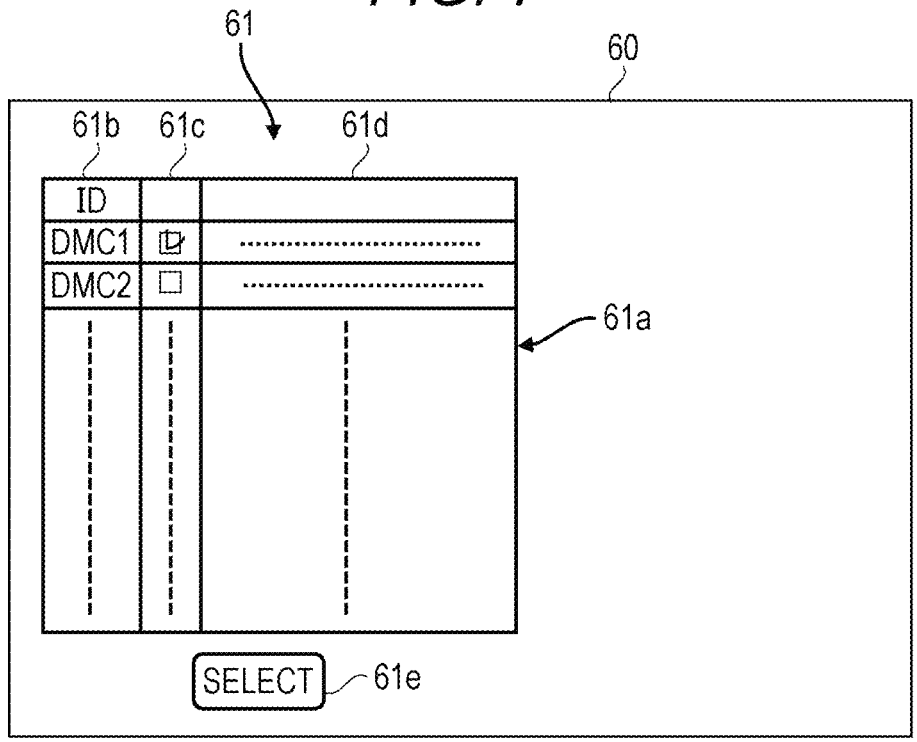
FIG. 7 is a diagram showing an example of a to-be-used-in-calculation device model selection screen.

Once the optical condition correction process is initiated, the user selects a to-be-used-in-calculation device model (step S10). FIG. 7 is a diagram showing an example of a to-be-used-in-calculation device model selection screen. On the to-be-used-in-calculation device model selection screen 61 shown in FIG. 7, for example, a list 61*a* of the to-be-used-in-calculation device models registered in the database 42 and a selection determination button 61*e* are displayed. The list 61*a* includes an ID display field 61*b* of each of the registered to-be-used-in-calculation device model, a to-be-used-in-calculation device model selection field 61*c*, and a details display field 61*d* of a corresponding to-be-used-in-calculation device model.

Herein, from the to-be-used-in-calculation device model selection screen 61 displayed on the display 60, a to-be-used-in-calculation device model for the correction sample is selected. Specifically, the user checks a check box corresponding to a to-be-used-in-calculation device model to be selected, and then touches the selection determination button 61*e* to finalize the selection of the to-be-used-in-calculation device model. FIG. 7 shows a case where a to-be-used-in-calculation device model for the correction sample assigned the ID "DMC1" is selected. The to-be-used-in-calculation device model thus selected is sent to the to-be-used-in-computation netlist generator 32 shown in FIG. 2.

Figure 8:
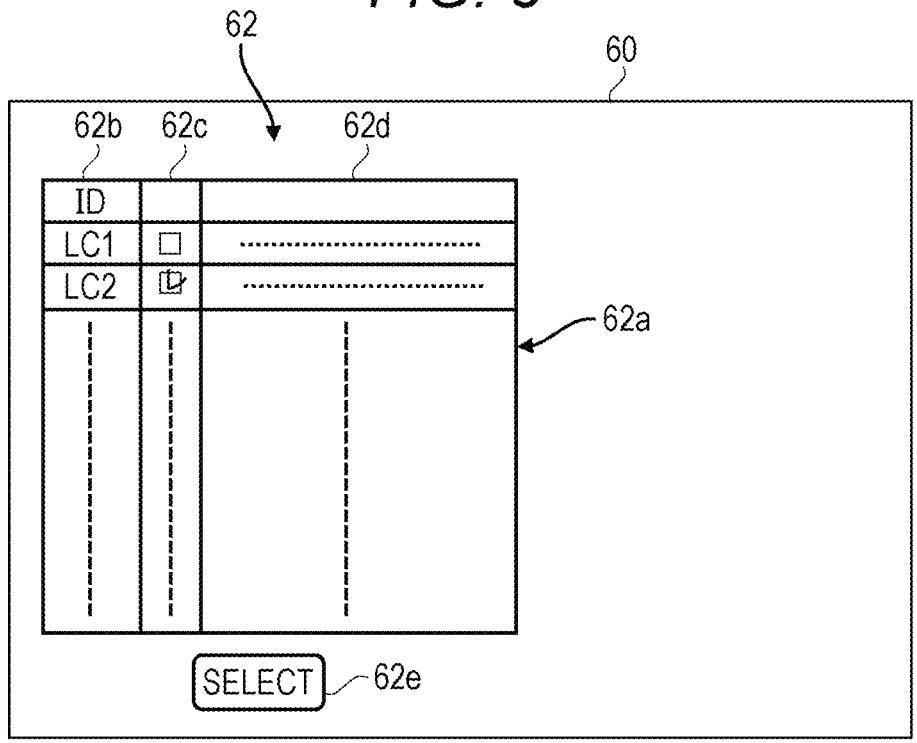
FIG. 8 is a diagram showing an example of an optical condition selection screen.

In step S10, an optical condition is also selected. FIG. 8 is a diagram showing an example of an optical condition selection screen. On the optical condition selection screen 62 shown in FIG. 8, for example, a list 62*a* of the optical conditions registered in the database 42 and a selection determination button 62*e* are displayed. The list 62*a* includes an ID display field 62*b* of each of the registered optical condition, an optical condition selection field 62*c*, and a details display field 62*d* of a corresponding optical condition.

The user selects a desired optical condition from the optical condition selection screen 62 displayed on the display 60. More specifically, the user checks a checkbox corresponding an optical condition to be selected, and then touches the selection determination button 62*e* to finalize the selection of the optical condition. FIG. 8 shows a case where an optical condition assigned the ID "LC2" is selected. Note that the reference optical condition described above may be selected as the optical condition. The optical condition thus selected is stored in the optical condition storage section 43 shown in FIG. 2.

Note that, in step S10, when the selection determination button 61*e* is touched to finalize the selection of the to-be-used-in-calculation device model, the optical condition selection screen 62 may be displayed after the to-be-used-in-calculation device model selection screen 61 is deleted. Further, when the selection of the to-be-used-in-calculation device model is finalized, the optical condition selection screen 62 may be displayed superimposed on the to-be-used-in-calculation device model selection screen 61. The optical condition selection screen 62 may be provided with a button that causes the to-be-used-in-calculation device model selection screen 61 to be displayed again.

Further, in the optical condition selection, the electron beam pulse conversion condition may also be selected, as necessary. Further, the electron beam pulse conversion condition may be used together with the optical condition, or the electron beam pulse conversion condition alone may be set as the optical condition. Note that the optical condition may be selected and stored in the optical condition storage section 43 before step S40 to be described later.

In step S20, a to-be-used-in-computation netlist is generated on the basis of the to-be-used-in-calculation device model selected by the user. For example, the to-be-used-in-computation netlist generator 32 combines any of the model 42*b*, the parameter type 42*d*, the shape of the device, or the physical properties of the device and the parameter value 42*e* included in the selected to-be-used-in-calculation device model to generate the to-be-used-in-computation netlist. Note that the to-be-used-in-computation netlist generation method is not limited to the above method.

In step S30, the to-be-used-in-computation netlist generated in step S20 is stored in the to-be-used-in-computation netlist storage section 44. Note that step S20 and step S30 are separately shown in FIG. 6, but the process of step S30 may be executed in step S20.

In step S40, an electron beam application result is estimated. The electron beam application result estimation computing unit 33 estimates the electron beam application result of the correction sample 24 on the basis of the to-be-used-in-computation netlist stored in the to-be-used-in-computation netlist storage section 44 and the optical condition stored in the optical condition storage section 43. The electron beam application result to be estimated here corresponds to an application result in step S80, that is, for example, the detection signal (signal waveform) output from the detector 25, an electrical charge, the inspection image, brightness of the inspection image, brightness of each pixel of the inspection image, or the like.

In step S50, the electron beam application result estimated in step S40 is stored in the estimated application result storage section 46.

In step S60, the optical condition is set. Note that, in FIG. 6, the optical condition is selected and set before the estimation of the electron beam application result in step S40. Therefore, no particular process is executed in step S60 of a first time. That is, in step S60, the optical condition corrected in step S120 to be described later is stored and set.

In step S70, the electron beam is applied to the correction sample 24 under the optical condition selected in step S10 or the like. The optical condition stored in the optical condition storage section 43 is sent to the controller 11 of the charged particle beam apparatus main body 10. The controller 11 controls each component of the charged particle beam optical system BS to apply the electron beam to the correction sample 24 under the optical condition thus received. When the electron beam is applied to the correction sample 24, the secondary electrons are emitted from the correction sample 24. When detecting the secondary electrons emitted from the correction sample 24, the detector 25 outputs a predetermined detection signal in accordance with the number of the secondary electrons, energy, or the like to the computer 30 (computing unit 31).

In step S80, an actual electron beam application result of the correction sample 24 is stored. The computing unit 31 may store, for example, the detection signal (signal waveform) output from the detector 25 in the electron beam application result storage section 45 as the electron beam application result. Further, the computing unit 31 may generate an inspection image (SEM image or the like) on the basis of the detection signal and store the inspection image in the electron beam application result storage section 45 as the electron beam application result. Further, the computing unit 31 may measure an electrical charge carried by the correction sample 24 on the basis of the detection signal and store the electrical charge thus measured in the electron beam application result storage section 45. Further, the computing unit 31 may detect brightness of the inspection image or brightness of each pixel of the inspection image and store the brightness thus detected in the electron beam application result storage section 45.

In step S90, the actual electron beam application result of the correction sample 24 and the estimated electron beam application result are compared. The comparator 34 compares the actual electron beam application result and the estimated electron beam application result for each item of the electron beam application result. The comparator 34 compares the detection signals for each electron beam application region or each pixel of the inspection image, for example. The comparator 34 also compares, for example, the electrical charge, the inspection image, the brightness of the inspection image, the brightness of each pixel of the inspection image, and the like. The comparator 34, for example, digitizes these application results and calculates a difference between the actual electron beam application result and the estimated electron beam application result for each item to generate a comparison result. Note that the comparator 34 may compare all of these items, or may compare only some of the items.

In step S100, a determination is made as to whether the actual electron beam application result of the correction sample 24 and the estimated electron beam application result coincide with each other on the basis of the comparison result calculated in step S90. For example, when a value of the comparison result is "0", the comparator 34 determines that these application results coincide with each other. On the other hand, when the value of the comparison result is not "0", the comparator 34 determines that these comparison results differs from each other. Note that, in practice, these application results rarely coincide with each other; therefore, it is necessary to take a measurement error within a predetermined range into account.

This allows the comparator 34 to determine that the application results coincide with each other when the value of the comparison result is equal to or less than a predetermined threshold. The predetermined threshold is defined for each item. Note that when the comparison is made for a plurality of items, the comparator 34 may determine that these application results coincide with each other only when the comparison results for all the items are equal to or less than the respective thresholds, or alternatively, may determine that these application results coincide with each other when the comparison results for at least a predetermined number of items are equal to or less than the respective thresholds.

When the comparator 34 determines in step S100 that these electron beam application results differ from each other (No), the process of step S110 is executed.

In step S110, the optical condition is corrected. The comparator 34 sends, for example, the comparison result to the optical condition correcting unit 35, and the optical condition correcting unit 35 corrects the optical condition. The optical condition correcting unit 35 reads, for example, the optical condition stored in the optical condition storage section 43, and corrects the optical condition thus read on the basis of the comparison result.

For example, the optical condition correcting unit 35 corrects the optical condition by changing a condition of each item of the set optical condition within a predetermined range in accordance with the comparison result. Further, the optical condition correcting unit 35 may predetermine an item whose condition is changeable from among the items of the optical condition and correct the optical condition by changing the condition only of the changeable item. This allows the user to easily grasp an influence on the comparison result between the electron beam application results before and after correction and to thereby correct the optical condition in a short time.

Further, the optical condition correcting unit 35 may correct the optical condition on the basis of a comparison result between the electron beam application results for each of the plurality of items. This makes it possible to increase accuracy in correction of the optical condition. Further, the optical condition correcting unit 35 may correct the optical condition on the basis of the electron beam application result for each of the plurality of elements. This makes it possible to increase accuracy in correction of the optical condition.

The optical condition thus corrected is stored in the optical condition storage section 43 (step S60). Under the corrected optical condition, the electron beam is applied to the correction sample 24 again (step S70), and the actual electron beam application result of the correction sample 24 is stored again (step S80). Then, the electron beam application result estimated using the optical condition before correction and the actual electron beam application result under the optical condition after correction are compared again (step S90). The processes of steps S60 to S110 are repeatedly executed until the estimated electron beam application result and the actual electron beam application result coincide with each other.

As described above, according to the present embodiment, the electron beam application result is estimated using the optical condition before correction. In other words, assuming that the estimated result based on the optical condition before correction is correct, the optical condition for the apparatus is corrected.

To put it simply, it is conceivable that the electron beam application result estimated on the basis of the to-be-used-in-computation netlist based on the to-be-used-in-calculation device model and the optical condition before correction will be the same even with any apparatus. On the other hand, even when the electron beam is applied to the correction sample 24 under the same optical condition, an error may occur in the electron beam application result between apparatuses. Therefore, correcting the optical condition on the basis of the estimated result considered to be invariable between apparatuses so as to cause the actual electron beam application result to coincide with the estimated result makes it is possible to reduce the machine difference between a plurality of apparatuses.

On the other hand, in step S100, when the comparator 34 determines that these electron beam application results coincide with each other (Yes), the process of step S120 is executed. In step S120, the optical condition stored in the database 42 is updated. For example, when receiving, from the comparator 34, the comparison result indicating that the actual electron beam application result of the correction sample 24 and the estimated electron beam application result coincide with each other, the optical condition correcting unit 35 determines that the correction of the optical condition has been completed, and then sends the optical condition after correction stored in the optical condition storage section 43 to the database 42 to store the optical condition in the database 42 with the optical condition after correction associated with the optical condition before correction.

Alternatively, the optical condition correcting unit 35 (another block of the computing unit 31) may compare the optical conditions before and after correction, calculate an optical condition correction coefficient for each item, and store the optical condition correction coefficient in the database 42 with the optical condition correction coefficient associated with the optical condition before correction stored in the database 42. In this case, the optical condition correction coefficient thus calculated may be stored as the other data 421 of a corresponding optical condition, for example. Then, when the updated optical condition is used, the value of each item of the optical condition is converted into a value based on the optical condition correction coefficient.

According to the present embodiment, the optical condition correction process may be executed on each optical condition stored in the database 42.

When the optical condition has been corrected, the updated optical condition and the optical condition correction coefficient may be displayed on the display 60. Note that processes such as the generation of the to-be-used-in-computation netlist, the measurement through the application of the electron beam, and the estimation of the electron beam application result have been described in order with reference to FIG. 6, but these processes may be executed in parallel. For example, the measurement of the actual electron beam application result through the application of the electron beam may be executed at the same time as the generation of the to-be-used-in-computation netlist and the estimation of the electron beam application result.

Further, artificial intelligence (AI) based on a method such as machine learning or deep learning may be applied to processes such as the estimation of the electron beam application result in step S40, the correction of the optical condition in step S110, and the like.

<Circuit Estimation Method for Sample>

Figure 9:
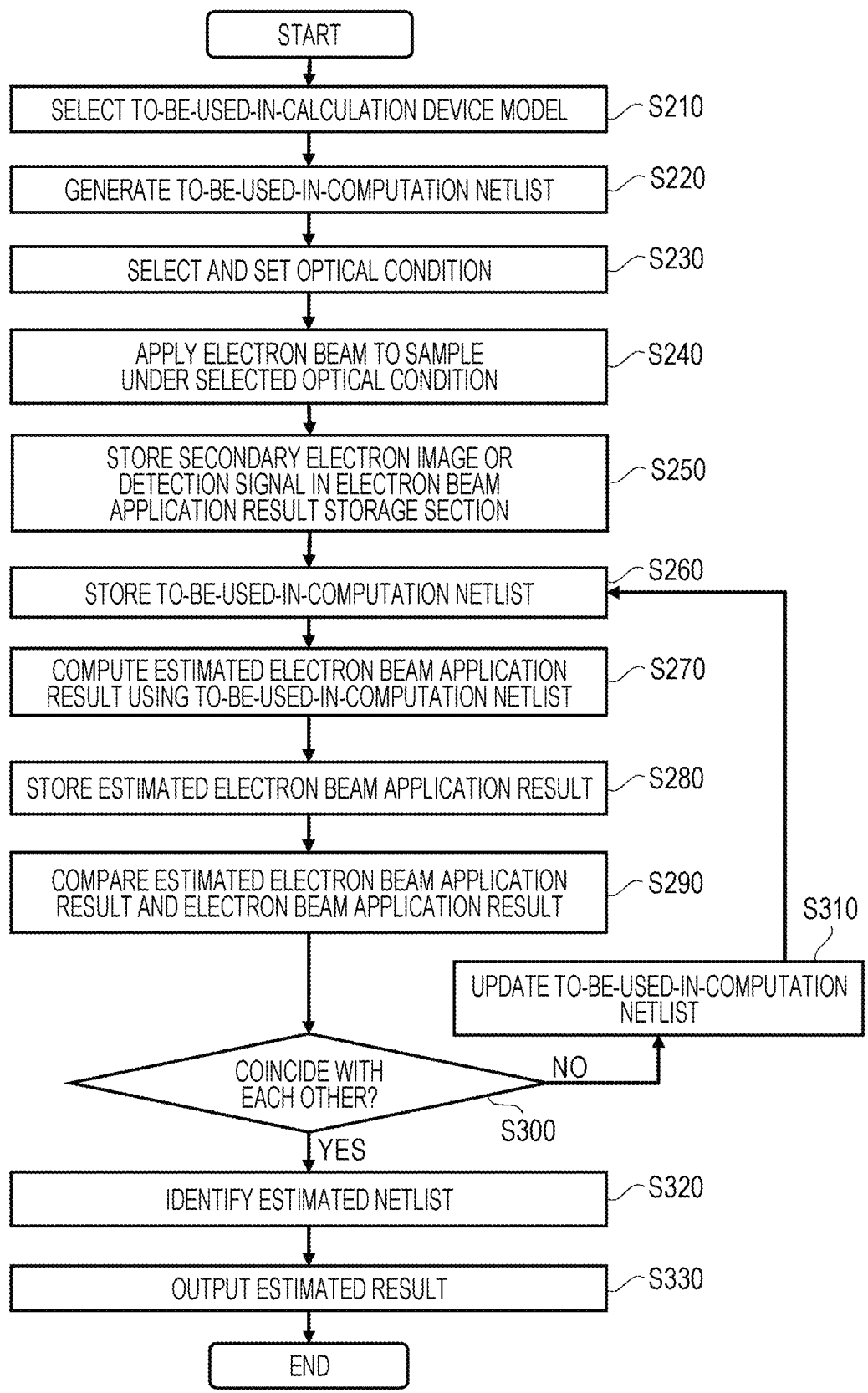
FIG. 9 is a flowchart showing an example of a circuit estimation method for a sample.

Next, a circuit estimation method for the sample 23 will be described. Herein, it is assumed that the correction process on each optical condition has already been completed. In the circuit estimation for the sample 23, a step having the same process as the optical condition correction is provided. Therefore, some description of the circuit estimation will be omitted below as appropriate. FIG. 9 is a flowchart showing an example of the circuit estimation method for the sample. In FIG. 9, the circuit estimation for the sample is made in steps S210 to S330.

Once the circuit estimation process is initiated, a to-be-used-in-calculation device model is selected (step S210). The process of step S210 is the same as step S10 shown in FIG. 6. The to-be-used-in-calculation device model is selected, for example, through the above-described to-be-used-in-calculation device model selection screen 61 shown in FIG. 7. The to-be-used-in-calculation device model thus selected is sent to the to-be-used-in-computation netlist generator 32 shown in FIG. 2.

In step S220, the to-be-used-in-computation netlist generator 32 generates a to-be-used-in-computation netlist on the basis of the to-be-used-in-calculation device model selected by the user. The process of step S220 is the same as step S20 shown in FIG. 6.

In step S230, an optical condition is selected. The process of step S230 is the same as step S10 shown in FIG. 6. The optical condition is selected, for example, through the above-described optical condition selection screen 62 shown in FIG. 8. The optical condition thus selected is stored in the optical condition storage section 43 shown in FIG. 2. Further, the optical condition may be set together with the electron beam pulse conversion condition, as necessary.

In step S240, the electron beam is applied to the sample 23 under the optical condition selected in step S230. The process of step S240 is the same as step S70 shown in FIG. 6. When detecting the secondary electrons emitted from the sample 23, the detector 25 outputs a predetermined detection signal in accordance with the number of the secondary electrons, energy, or the like to the computer 30 (computing unit 31).

In step S250, an actual electron beam application result of the sample 23 is stored. The process of step S250 is the same as step S80 shown in FIG. 6. The electron beam application result corresponds to, for example, the detection signal, the electrical charge, the inspection image, the brightness of the inspection image, the brightness of each pixel, or the like.

In step S260, the to-be-used-in-computation netlist generated in step S220 is stored in the to-be-used-in-computation netlist storage section 44. Note that step S220 and step S260 are separately shown in FIG. 9, but the process of step S260 may be executed in step S220.

In step S270, an electron beam application result is estimated. The process of step S270 is the same as step S40 shown in FIG. 6.

In step S280, the electron beam application result estimated in step S270 is stored in the estimated application result storage section 46. The process of step S280 is the same as step S50 shown in FIG. 6.

In step S290, the actual electron beam application result and the estimated electron beam application result are compared. The process of step S290 is the same as step S90 shown in FIG. 6.

In step S300, a determination is made as to whether the actual electron beam application result and the estimated electron beam application result coincide with each other on the basis of the comparison result calculated in step S290. The process of step S300 is the same as step S100 shown in FIG. 6. When the comparator 34 determines in step S200 that these electron beam application results differ from each other (No), the process of step S310 is executed.

In step S310, the to-be-used-in-computation netlist is updated. The comparator 34 sends the comparison result to the to-be-used-in-computation netlist generator 32, and the to-be-used-in-computation netlist generator 32 updates the to-be-used-in-computation netlist, for example. The to-be-used-in-computation netlist generator 32 changes, on the basis of the comparison result, a parameter value used in generation of the last to-be-used-in-computation netlist, and generates a to-be-used-in-computation netlist using the parameter value thus changed, for example. As described above, the to-be-used-in-computation netlist generator 32 updates the to-be-used-in-computation netlist. At this time, the to-be-used-in-computation netlist generator 32 may change the parameter value on the basis of the comparison results for a plurality of items. Further, the to-be-used-in-computation netlist generator 32 may preset a parameter whose parameter value is variable and update the to-be-used-in-computation netlist while changing the parameter value of only such a variable parameter.

The to-be-used-in-computation netlist thus updated is stored in the to-be-used-in-computation netlist storage section 44 (step S260). The electron beam application result is estimated again using the updated to-be-used-in-computation netlist and the optical condition (step S270), and the estimated electron beam application result is stored in the estimated application result storage section 46 (step S280). Then, the electron beam application result estimated using the updated to-be-used-in-computation netlist and the actual electron beam application result are compared again (step S290).

The processes of steps S260 to S310 are repeatedly executed until the estimated electron beam application result and the actual electron beam application result coincide with each other. Note that the to-be-used-in-computation netlist may be updated in the to-be-used-in-computation netlist storage section 44. In this case, the processes of steps S270 to S310 are repeatedly executed until the estimated electron beam application result and the actual electron beam application result coincide with each other.

On the other hand, in step S300, when the comparator 34 determines that these electron beam application results coincide with each other (Yes), the process of step S320 is executed. In step S320, the computing unit 31 (comparator 34) determines that the to-be-used-in-computation netlist stored in the to-be-used-in-computation netlist storage section 44 can be identified as a netlist describing the circuit of the sample 23, and stores this to-be-used-in-computation netlist in the estimated netlist storage section 47 as an estimated netlist. Further, in addition to the estimated netlist, a correspondence table that associates a position of a plug electrode in the inspection image with each node in the estimated netlist may be stored in the estimated netlist storage section 47.

In step S330, the estimation result and measurement result are output to the input and output part 50. For example, the estimated netlist stored in the estimated netlist storage section 47, the estimated electron beam application result stored in the estimated application result storage section 46, the actual electron beam application result stored in the electron beam application result storage section 45 are output to the input and output part 50 and displayed on the display 60.

Figure 10:
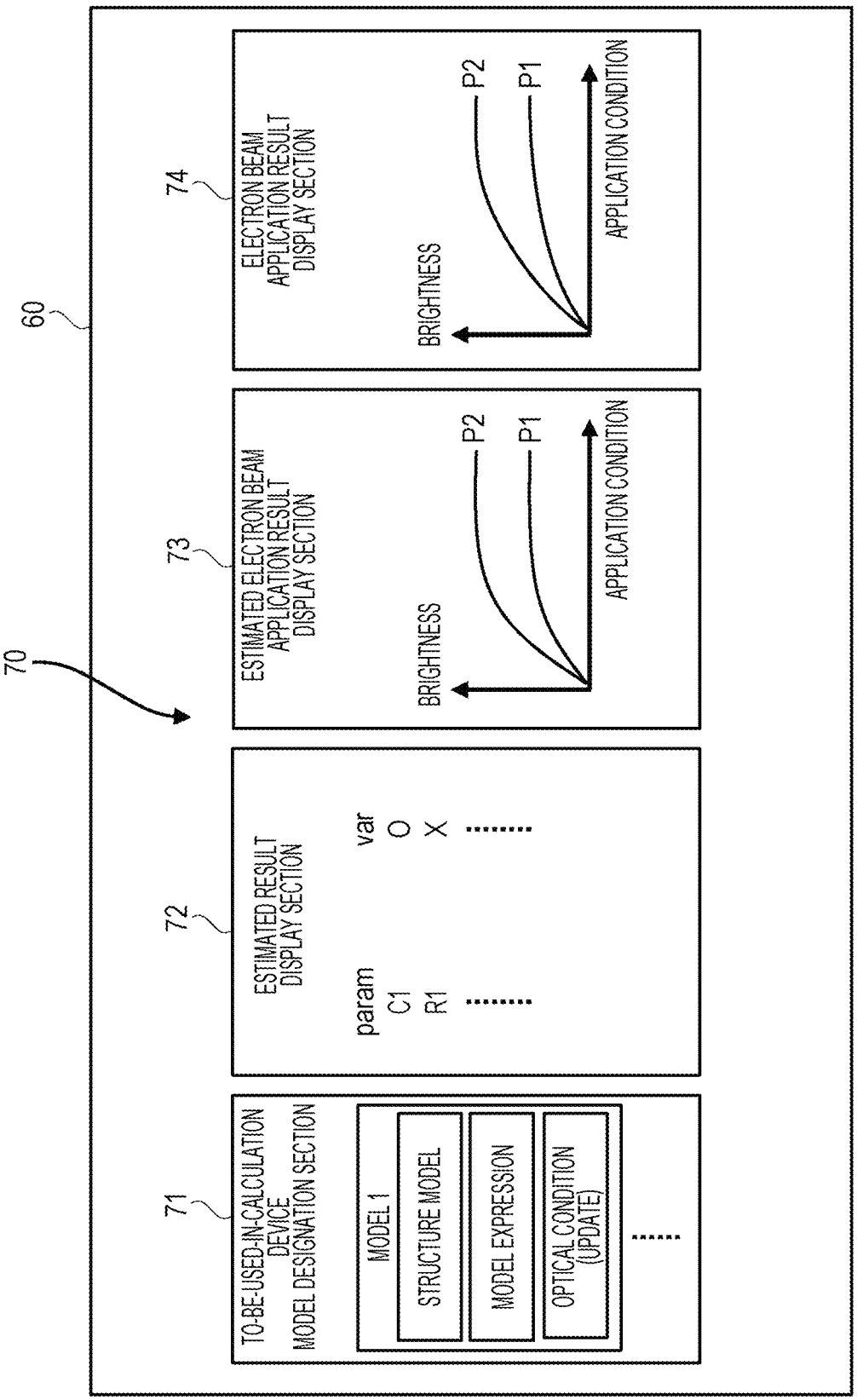
FIG. 10 is a diagram showing an example of a result display screen after circuit estimation.

FIG. 10 is a diagram showing an example of a result display screen after circuit estimation. As shown in FIG. 10, a to-be-used-in-calculation device model designation section 71, an estimated result display section 72, an estimated electron beam application result display section 73, and an electron beam application result display section 74 are each displayed as a result display screen 70.

In the to-be-used-in-calculation device model designation section 71, details of the selected to-be-used-in-calculation device model, the selected optical condition, and the like are displayed. For example, the user can confirm the details of the selected to-be-used-in-calculation device model and optical condition by touching the to-be-used-in-calculation device model designation section 71. In the estimated result display section 72, each parameter value used in generation of the estimated netlist is displayed. Further, in the estimated result display section 72, information on whether the parameter is variable may be displayed together with the parameter value. Note that the optical condition correction result or the optical condition correction coefficient may be displayed on the estimated result display section 72 or the like.

In the estimated electron beam application result display section 73, the estimated electron beam application result is displayed. In the estimated electron beam application result display section 73, a graph in which the horizontal axis represents the electron beam application condition (optical condition), and the vertical axis represents the brightness (brightness) is displayed. Specifically, in the estimated electron beam application result display section 73, electron beam application results estimated for a plurality of nodes (plug electrodes) are displayed. Note that, in the estimated electron beam application result display section 73, not only the estimated result using the estimated netlist but also the estimated result using the to-be-used-in-computation netlist before being identified may be displayed.

In the electron beam application result display section 74, the actually measured electron beam application result is displayed. In the electron beam application result display section 74, a graph in which the horizontal axis represents the electron beam application condition and the vertical axis represents the brightness is displayed in the same manner. In the electron beam application result display section 74, electron beam application results for a plurality of nodes are displayed.

Note that the graphs displayed in the estimated electron beam application result display section 73 and the electron beam application result display section 74 can be configured as desired. For example, a graph in which the vertical axis represents the amount of detected secondary electrons may be displayed. Further, in each of the estimated electron beam application result display section 73 and the electron beam application result display section 74, the waveform of the detection signal, the inspection image, and the like may be displayed.

Further, the estimated electron beam application result display section 73 and the electron beam application result display section 74 may be combined such that the estimated result and the measured result are displayed together.

FIGS. 11A to 11C are diagrams showing another example of the result display screen after circuit estimation. In the result display screen 70, not only the sections shown in FIG. 10, but also images shown in FIGS. 11A to 11C may be displayed, for example. FIG. 11A is an image representing an inspection image in which coordinates of plug electrodes are additionally illustrated. FIG. 11B is an estimated netlist. FIG. 11C is a correspondence table that associates each of the positions of the plug electrode in the inspection image with a corresponding node in the estimated netlist. Further, a circuit diagram based on the estimated netlist may be displayed in the result display screen 70.

Note that processes such as the generation of the to-be-used-in-computation netlist, the measurement through the application of the electron beam, and the estimation of the electron beam application result have been described in order with reference to FIG. 9, but these processes may be executed in parallel. For example, the measurement through application of the electron beam may be executed at the same time as the generation of the to-be-used-in-computation netlist and the estimation of the electron beam application result.

Further, AI based on a method such as machine learning or deep learning may be applied to processes such as the estimation of the electron beam application result in step S270, the update on the to-be-used-in-computation netlist in step S310, and the like.

<Main Effects of the Present Embodiment>

According to the present embodiment, the optical condition is corrected on the basis of a comparison between the estimated electron beam application result of the correction sample 24 and the electron beam application result when the electron beam is actually applied to the correction sample 24. This configuration makes it possible to reduce an error in the electron beam application result of the sample 23 or correction sample 24 between apparatuses, that is, the machine difference.

Further, according to the present embodiment, the computing unit 31 corrects the optical condition by changing a condition of each item of the optical condition within a predetermined range in accordance with the comparison result between the first application result and the second application result. This configuration makes it possible to suitably correct the optical condition and to thereby shorten a time required until the optical condition is updated.

Further, according to the present embodiment, the computing unit 31 predetermines a changeable item from among the items of the optical condition, and corrects the optical condition by changing only the condition of the changeable item. This configuration makes it possible to reduce the number of items whose conditions are changeable and to thereby shorten a time required until the optical condition is updated. This configuration further makes it possible to determine the optical condition that affects a difference between the electron beam application results and to thereby efficiently correct and update the optical condition.

Further, according to the present embodiment, the correction sample 24 includes a plurality of elements, and the computing unit 31 corrects, for each of the plurality of elements, the optical condition on the basis of the first application result and the second application result. This configuration makes it possible to obtain more information for use in correction of the optical condition and to thereby increase accuracy in correction of the optical condition.

Further, according to the present embodiment, the computing unit 31 corrects a plurality of optical conditions. This configuration makes a plurality of optimized optical conditions available. Further, it is possible to measure the sample 23 in more detail.

Further, according to the present embodiment, the computing unit 31 stores, when the first application result and the second application result coincide with each other, the optical condition after correction in the database 42 with the optical condition after correction associated with the optical condition before correction stored in the database 42. This configuration makes the optical conditions before and after correction available.

Further, according to the present embodiment, the computing unit 31 compares the optical condition before correction and the optical condition after correction to calculate an optical condition correction coefficient for each of the items, and stores the optical condition correction coefficient in the database 42 with the optical condition correction coefficient associated with the optical condition before correction. This configuration eliminates the need for separately storing the optical condition after correction and thereby makes it possible to reduce the amount of information stored in the database 42.

Further, according to the present embodiment, the to-be-used-in-calculation device model includes a model representing a defect in the sample 23. This configuration allows measurement of the sample 23 or correction sample 24 having a defect structure in the sample 23. This makes it possible to easily detect a defect (manufacturing defect) in the sample 23 and to thereby increase accuracy in circuit estimation.

Further, according to the present embodiment, the to-be-used-in-computation netlist is generated on the basis of the to-be-used-in-calculation device model, and the electron beam application result when the electron beam is applied to the sample is estimated on the basis of the to-be-used-in-computation netlist and the optical condition. Further, the estimated electron beam application result is compared with the electron beam application result when the electron beam is applied to the sample 23 on the basis of the optical condition.

This configuration eliminates the need of converting an external netlist input from the outside into the to-be-used-in-computation netlist, and thereby allows the electrical characteristics of the sample 23 to be estimated in a short time, increasing the throughput. The configuration further allows the electrical characteristics and circuit of the sample 23 to be freely estimated without being affected by the configuration of the external netlist, and thereby allows the electrical characteristics to be estimated with consideration given to interactions between a plurality of devices.

Further, according to the present embodiment, when the estimated electron beam application result and the actual electron beam application result differ from each other, the to-be-used-in-calculation device model is updated. Specifically, the computing unit 31 updates the to-be-used-in-computation netlist by changing the parameter value included in the to-be-used-in-calculation device model and creating the to-be-used-in-computation netlist again using the changed parameter value. This configuration makes it possible to update the to-be-used-in-computation netlist while suppressing the computation amount and to thereby suppress a load on the computing unit 31.

Further, according to the present embodiment, the electron beam application result includes any one of the detection signal, the inspection image based on the detection signal, the brightness of the inspection image, or the brightness of each pixel in the inspection image. This configuration makes it is possible to collate application results with various forms based on the detection signal.

Further, according to the present embodiment, the to-be-used-in-calculation device model includes any one of a model defining a circuit of a device, a mathematical expression defining electrical characteristics of the device, a shape of the device, or physical properties of the device. This configuration makes it possible to estimate the circuit of the sample 23 from not only the circuit configuration but also the electrical characteristics, the shape, the physical properties, and the like and to thereby increase accuracy in circuit estimation.

Further, according to the present embodiment, the computing unit 31 generates a correspondence table that associates the position of the plug electrode in the inspection image with each node in the identified to-be-used-in-computation netlist (estimated netlist). This configuration makes the correspondence between the netlist and the inspection image clear.

Further, according to the present embodiment, the electron beam application result is estimated on the basis of the optical condition and the pulse conversion condition. This configuration makes it is possible to increase accuracy in estimation of the electrical characteristics of the sample 23 with the electron beam that changes in a complicated manner.

Second Embodiment

Next, a second embodiment will be described. According to the present embodiment, as the correction sample 24, an external sample 23a (see FIG. 1 or the like) whose circuit or electrical characteristics are estimated by another charged particle beam apparatus.

The external sample 23a is, for example, a wafer prepared in advance for use in apparatus maintenance. Further, the external sample 23a may be, for example, a device of a level that can be shipped as a product, unlike the correction sample 24 that is primarily configured by a TEG or the like. It is assumed that characteristics such as the circuit or electrical characteristics of the external sample 23a have already been made clear by another charged particle beam apparatus or the like. Then, it is assumed that the database 42 has already stored a to-be-used-in-calculation device model corresponding to the external sample 23a. Therefore, the present embodiment eliminates the need of the correction sample 24 shown in FIGS. 1 and 2 and allows only the external sample 23a (sample 23) to be placed in the sample chamber 10B.

<Optical Condition Correction>

Figure 12:
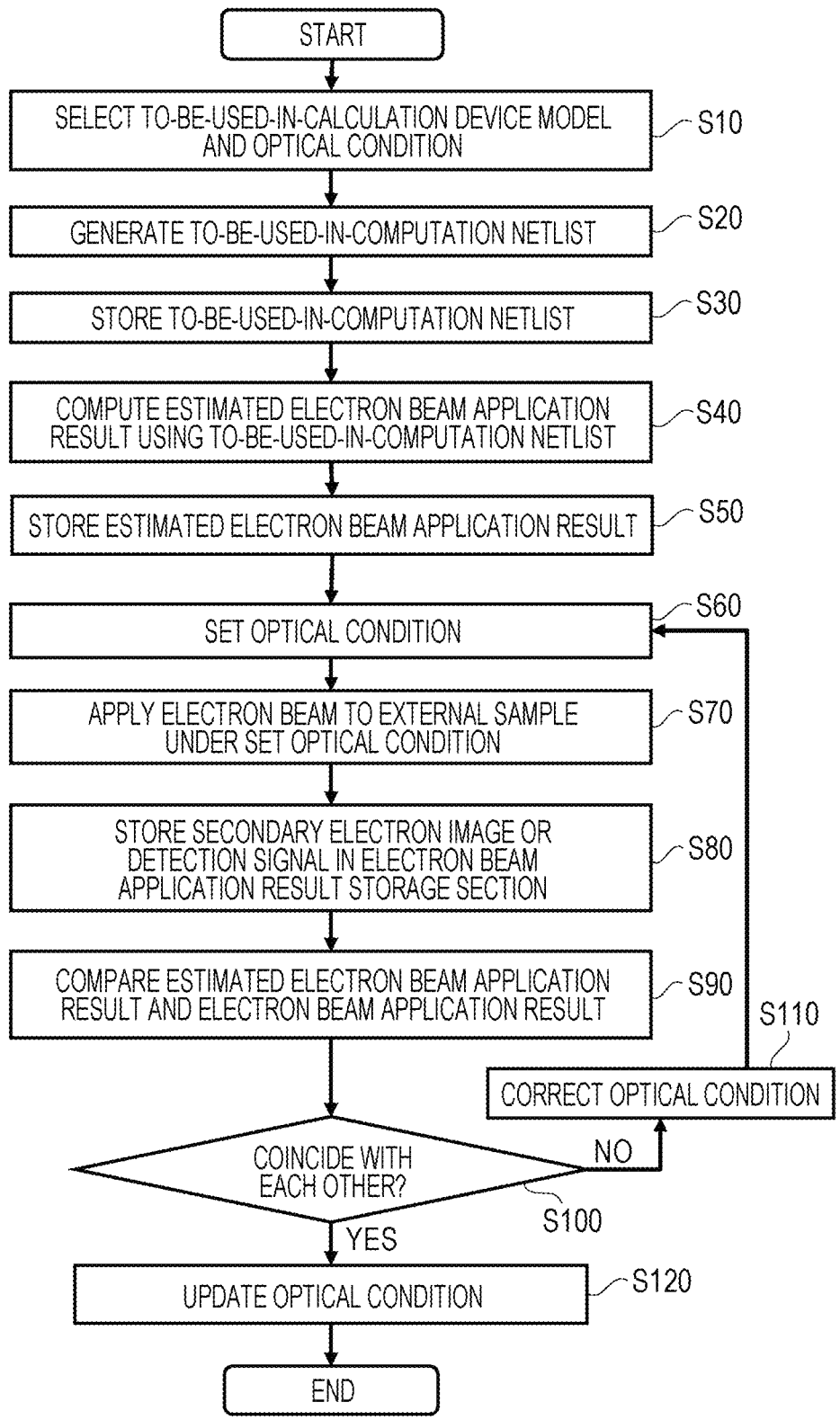
FIG. 12 is a flowchart showing an example of an optical condition correction method according to a second embodiment of the present invention.

FIG. 12 is a flowchart showing an example of the optical condition correction method according to the second embodiment of the present invention. FIG. 12 is similar to FIG. 6 but is different from FIG. 6 only in that the sample for which the optical condition is corrected is the external sample 23a rather than the correction sample 24. Therefore, the same reference numerals as shown in FIG. 6 are applied to each step shown in FIG. 12.

In step S10, the to-be-used-in-calculation device model corresponding to the external sample 23a is selected. Note that the method for selecting the to-be-used-in-calculation device model or the optical condition is the same as in the first embodiment. In step S40, the electron beam application result of the external sample 23a is estimated. As described above, since the characteristics of the external sample 23a have already been made clear, the subsequent processes are executed on the assumption that an estimated result of the electron beam application result of the external sample 23a is correct.

In step S70, the electron beam is applied to the external sample 23a under the selected optical condition. In step S90, the estimated result of the electron beam application result of the external sample 23a and the actual electron beam application result are compared. When these electron beam application results differ from each other (No in step S100), the optical condition is corrected (step S110).

<Main Effects of the Present Embodiment>

According to the present embodiment, the following effects can be obtained in addition to the effects of the above-described embodiment. According to the present embodiment, the optical condition is corrected using the external sample 23a. This configuration makes it possible to reduce a difference in the electron beam application result between apparatuses without preparing the correction sample 24. Further, this configuration eliminates the need for managing the correction sample 24.

Third Embodiment

Next, a third embodiment will be described. The correction sample 24 is usually left in the sample chamber 10B, but its electrical characteristics may deteriorate with time. Therefore, in the present embodiment, a method of updating the to-be-used-in-calculation device model in a manner that depends on deterioration of the correction sample 24 will be described.

Figure 13:
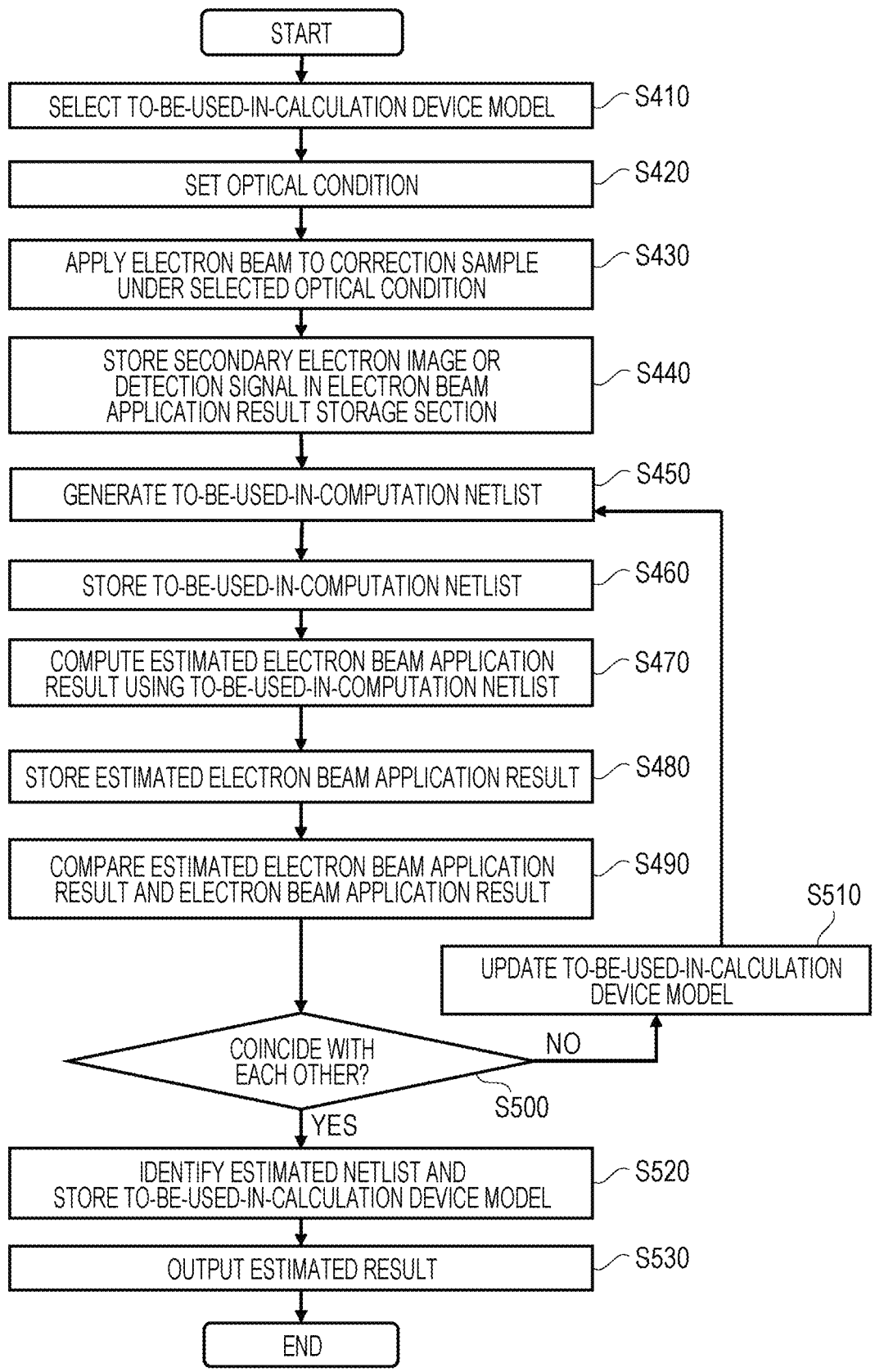
FIG. 13 is a flowchart showing an example of a process of updating the to-be-used-in-calculation device model according to a third embodiment of the present invention.

FIG. 13 is a flowchart showing an example of a process of updating the to-be-used-in-calculation device model according to the third embodiment of the present invention. FIG. 13 is similar to FIG. 9. In FIG. 13, the processes of steps S410 to S530 are executed. First, in step S410, a to-be-used-in-calculation device model corresponding to the correction sample 24 is selected. Step S410 is the same as step S210 shown in FIG. 9.

In step S420, an optical condition is selected. Note that it is preferable that the optical condition to be selected have already been corrected. Step S420 is the same as step S230 shown in FIG. 9. In step S430, the electron beam is applied to the correction sample 24 under the optical condition selected in step S420. Step S430 is the same as step S240 shown in FIG. 9. In step S440, an actual electron beam application result (third application result) of the correction sample 24 is stored. Step S440 is the same as step S250 shown in FIG. 9.

In step S450, a to-be-used-in-computation netlist is generated on the basis of the to-be-used-in-calculation device model selected in step S410. Step S450 is the same as step S220 shown in FIG. 9.

In step S460, the to-be-used-in-computation netlist generated in step S450 is stored in the to-be-used-in-computation netlist storage section 44. Step S460 is the same as step S260 shown in FIG. 9. In step S470, an electron beam application result is estimated. Step S470 is the same as step S270 shown in FIG. 9.

In step S480, the electron beam application result estimated in step S470 is stored in the estimated application result storage section 46. Step S480 is the same as step S280 shown in FIG. 9. In step S490, the actual electron beam application result and the estimated electron beam application result are compared. The process of step S490 is the same as step S290 shown in FIG. 9.

In step S500, a determination is made as to whether the actual electron beam application result and the estimated electron beam application result coincide with each other on the basis of the comparison result calculated in step S490. The process of step S500 is the same as step S300 shown in FIG. 9. When the comparator 34 determines in step S500 that these electron beam application results differ from each other (No), the process of step S510 is executed.

In step S510, the to-be-used-in-calculation device model corresponding to the correction sample 24 is updated. The computing unit 31 updates the to-be-used-in-calculation device model on the basis of the comparison result from the comparator 34. The computing unit 31 may update the to-be-used-in-calculation device model by changing, for example, a model that defines a circuit of the device, a mathematical expression that defines electrical characteristics of the device, a shape of the device, and physical properties of the device, or alternatively, may update the to-be-used-in-calculation device model by changing the parameter value 42e of each parameter type 42d. The to-be-used-in-calculation device model may be updated, for example, by the to-be-used-in-computation netlist generator 32 or through direct access to the database 42.

The processes of steps S450 to S510 are repeatedly executed until the estimated electron beam application result and the actual electron beam application result coincide with each other.

On the other hand, in step S500, when the comparator 34 determines that these electron beam application results coincide with each other (Yes), the process of step S520 is executed. In step S520, the computing unit 31 (comparator 34) determines that the to-be-used-in-computation netlist stored in the to-be-used-in-computation netlist storage section 44 can be identified as a netlist describing the circuit of the correction sample 24 and stores this to-be-used-in-computation netlist in the estimated netlist storage section 47 as an estimated netlist. Further, in addition to the estimated netlist, a correspondence table that associates a position of a plug electrode in the inspection image with each node in the estimated netlist may be stored in the estimated netlist storage section 47. The process of step S520 is the same as step S320 shown in FIG. 9.

Further, in step S520, the to-be-used-in-calculation device model updated in step S510 is stored in the database 42. At this time, the to-be-used-in-calculation device model before update may remain stored in the database 42.

In step S530, the estimation result and measurement result are output to the input and output part 50. The process of step S530 is the same as step S330 shown in FIG. 9. Note that, on the display 60, an image representing that the to-be-used-in-calculation device model has been updated may be displayed.

<Main Effects of the Present Embodiment>

According to the present embodiment, after the optical condition is corrected, the first application result is compared with the third application result when the charged particle beam is applied to the correction sample 24 under the optical condition. When the first application result and the third application result differ from each other, the to-be-used-in-calculation device model corresponding to the correction sample 24 is updated. This configuration makes it possible to facilitate the update on the to-be-used-in-calculation device model in a manner that depends on a degree of deterioration of the correction sample 24. This makes the correction sample 24 usable for a long period of time.

Note that the present invention is not limited to the above-described embodiments and includes various modifications. Further, some of the components of one embodiment can be replaced with corresponding components of another embodiment, and a component of another embodiment can be added to the components of one embodiment. Further, it is possible to add different components to the components of each embodiment, delete some of the components of each embodiment, and replace some of the components of each embodiment with different components. Note that each member and relative size shown in the drawings have been simplified and idealized for easy understanding of the present invention, and the present invention may have a more complicated shape when being implemented.

What is claimed is:

1. A control method for a charged particle beam apparatus comprising:
   estimating a circuit of a sample or a correction sample using a to-be-used-in-calculation device model under at least one optical condition in which a charged particle beam is applied to the sample or the correction sample;
   generating a detection signal based on
   secondary electrons emitted from the sample or the correction sample excited by the application of the charged particle beam which is applied to the sample or the correction sample under the at least one optical condition;
   generating a to-be-used-in-computation netlist on a basis of the to-be-used-in-calculation device model corresponding to the correction sample;
   estimating, on a basis of the to-be-used-in-computation netlist and the at least one optical condition, a first application result when the charged particle beam is applied to the correction sample under the at least one optical condition;
   comparing the first application result with a second application result based on the detection signal when the charged particle beam is applied to the correction sample under the at least one optical condition; and
   correcting the at least one optical condition when the first application result and the second application result differ from each other.

2. The control method according to claim 1, wherein said step of correcting the at least one optical condition comprises changing a condition of each of items of the at least one optical condition within a predetermined range in accordance with the comparison result between the first application result and the second application result.

3. The control method according to claim 1, further comprising:
   predetermining a changeable item from among the items of the at least one optical condition; and
   correcting the at least one optical condition by changing only a condition of the changeable item.

4. The control method according to claim 1, wherein
   the correction sample includes a plurality of elements, and
   said correcting the at least one optical condition is performed on a basis of the first application result and the second application result for each of the plurality of elements.

5. The control method according to claim 1, wherein said correcting the at least one optical condition comprises correcting a plurality of optical conditions.

6. The control method according to claim 1, further comprising storing, when the first application result and the second application result coincide with each other, the at least one optical condition after correction in the database with the at least one optical condition after correction associated with the at least one optical condition before correction stored in a database.

7. The control method according to claim 6, further comprising:

comparing the at least one optical condition before correction and the at least one optical condition after correction to calculate an optical condition correction coefficient for each of the items; and storing the optical condition correction coefficient in the database with the optical condition correction coefficient associated with the at least one optical condition before correction.

8. The control method according to claim 1, wherein the to-be-used-in-calculation device model includes a model representing a defect in a device.

9. The control method according to claim 1, wherein the to-be-used-in-calculation device model includes any one of a model defining a circuit of a device, a mathematical expression defining electrical characteristics of the device, a shape of the device, or physical properties of the device.

10. The control method according to claim 9, wherein the to-be-used-in-calculation device model includes a parameter value of a circuit element included in the circuit of the device.

11. The control method according to claim 1, further comprising:

storing a pulse conversion condition under which the charged particle beam is pulsed;

controlling the charged particle beam optical system to control the charged particle beam applied to the sample under the at least one optical condition and the pulse conversion condition; and estimating the first application result on a basis of the at least one optical condition and the pulse conversion condition.

12. The control method according to claim 1, wherein the correction sample is an external sample for which a circuit has been estimated by another of the charged particle beam apparatus, and the method further comprises storing the to-be-used-in-calculation device model corresponding to the external sample.

13. The control method according to claim 1, further comprising:

after correcting the optical condition, comparing the first application result and a third application result when the charged particle beam is applied to the correction sample under the at least one optical condition; and when the first application result and the third application result differ from each other, updating the to-be-used-in-calculation device corresponding to the correction sample.

14. The control method according to claim 13, further comprising:

changing a parameter value included in the to-be-used-in-calculation device model corresponding to the correction sample; and updating the to-be-used-in-computation netlist using the parameter value changed.

15. The control method according to claim 1, wherein the second application result includes at least any one of the detection signal, an inspection image based on the detection signal, the brightness of the inspection image, the brightness of each pixel of the inspection image.

16. A control method of a charged particle beam apparatus comprising:

receiving, by a calculation device, a first input indicating information at least one of a circuit model of an electronic circuit formed on a semiconductor wafer, and a netlist of the electronic circuit;

calculating, by the calculation device, a first inspection condition of a first inspection tool corresponding to at least one of the circuit model or the netlist, and an first inspection result obtained by inspecting the first inspection tool with the first inspection condition based on the first input;

receiving a second inspection result obtained by inspecting the semiconductor wafer corresponding to at least one of the circuit model and the netlist with a second inspection tool setting the first inspection condition; and adjusting an inspection condition of the second inspection tool with the first inspection result and the second inspection result.

* * * * *